(12) United States Patent
Wang et al.

(10) Patent No.: US 9,121,872 B2
(45) Date of Patent: Sep. 1, 2015

(54) ELECTRO-OPTIC EFFECT BASED OPTICAL VOLTAGE TRANSFORMER

(75) Inventors: Wei Wang, Beijing (CN); Zhixin Zhang, Beijing (CN); Jinquan Tan, Beijing (CN); Xuefeng Wang, Beijing (CN); Junlei Xia, Beijing (CN)

(73) Assignee: BEIJING AEROSPACE TIMES OPTICAL-ELECTRONIC TECHNOLOGY CO. LTD., Beijing (CN)

( * ) Notice: Subject to any disclaimer, the term of this patent is extended or adjusted under 35 U.S.C. 154(b) by 123 days.

(21) Appl. No.: 13/696,175

(22) PCT Filed: Oct. 31, 2011

(86) PCT No.: PCT/CN2011/081579
§ 371 (c)(1),
(2), (4) Date: Nov. 5, 2012

(87) PCT Pub. No.: WO2013/044542
PCT Pub. Date: Apr. 4, 2013

(65) Prior Publication Data
US 2013/0076338 A1 Mar. 28, 2013

(30) Foreign Application Priority Data

Sep. 26, 2011 (CN) .......................... 2011 1 0288578
Sep. 26, 2011 (CN) .......................... 2011 1 0288596
Sep. 26, 2011 (CN) .......................... 2011 1 0288611
Sep. 26, 2011 (CN) .......................... 2011 1 0288616
Sep. 26, 2011 (CN) .......................... 2011 1 0288619

(51) Int. Cl.
*G01R 31/00* (2006.01)
*G01R 19/155* (2006.01)
*G01R 15/24* (2006.01)

(52) U.S. Cl.
CPC ............ *G01R 19/155* (2013.01); *G01R 15/242* (2013.01); *G01R 15/247* (2013.01)

(58) Field of Classification Search
CPC ............ G01R 15/242; G01R 19/0046; G01R 15/247; G01R 19/155; G01R 1/071; G01R 31/308; G01R 15/241; G01R 31/2656; G01R 15/246; G01R 15/142; G01R 15/24; G01D 5/353; G01J 4/04; G02F 1/03; G02F 1/21; G01B 11/168; G01N 21/4795; G01N 21/27; G01N 21/55; G01N 2021/4709; G01N 2021/4792; G01N 21/21; G01N 21/474; G01N 21/49; G01N 21/211; G01N 21/39; G01N 21/23; G01N 2021/0346; G01N 2021/432; G01N 2021/4714; G01N 2021/7789; G01N 21/05; G01N 21/45; G01N 21/553; G01N 21/7746
See application file for complete search history.

(56) References Cited

U.S. PATENT DOCUMENTS 4,866,372 A * 9/1989 Aoshima et al. ................. 324/96
4,872,754 A * 10/1989 Ensley .......................... 356/464

(Continued)

FOREIGN PATENT DOCUMENTS

| CN | 85107527 A | 4/1987 |
|---|---|---|
| CN | 2329005 Y | 7/1999 |

(Continued)

OTHER PUBLICATIONS

Zhao Yongpeng,Wu Chongqing Institute of Lightwave Technology of Northern Jiaotong University,Beijing 100044; Study on Electro-optical Voltage Sensor[J];Instrument Technique and Sensor;1999-029.

(Continued)

*Primary Examiner* — Vinh Nguyen
(74) *Attorney, Agent, or Firm* — Maschoff Brennan

(57) ABSTRACT

An electro-optic effect based optical voltage transformer comprises an optical voltage sensor head and an electrical unit, wherein the electrical unit comprises an optical closed-loop feedback control unit and a signal processing unit, the optical closed-loop feedback control unit is connected to the optical voltage sensor head and the optical voltage sensor head is connected to the signal processing unit. In this invention, the light source output power is more stable, the light source center wavelength drift is effectively controlled and the output power coastdown caused by light source aging is prevented; the optical power fluctuation of the optical polarization caused by factors such as temperature, optical fiber vibration, etc., is eliminated, which is conductive to stability and reliability of the optical system; the accuracy of data is improved.

26 Claims, 7 Drawing Sheets

(56) References Cited

U.S. PATENT DOCUMENTS

| | | | |
|---|---|---|---|
| 5,034,679 A * | 7/1991 | Henderson et al. | 324/96 |
| 5,111,135 A | 5/1992 | Kozuka et al. | |
| 5,247,244 A * | 9/1993 | Miller et al. | 324/96 |
| 6,204,921 B1 * | 3/2001 | Strandjord et al. | 356/460 |

FOREIGN PATENT DOCUMENTS

| | | |
|---|---|---|
| CN | 2365747 Y | 2/2000 |
| CN | 2775814 Y | 4/2006 |
| CN | 101408558 A | 4/2009 |
| CN | 101424708 A | 5/2009 |
| JP | 08-211107 A | 8/1996 |
| JP | 10-332746 A | 12/1998 |

OTHER PUBLICATIONS

Luo Su-nan, Ye Miao-yuan, and Xu Yan, "Stability Research on Optical Fiber Voltage Transformer," Proceedings of the CSEE, vol. 20(12), pp. 15-19, 2000.

Zheng Weimin et al., "A Novel High-sensitive Photo-electric Micropressure Sensor" Chinese Journal of Scientific Instrument, 1997, 18(4) : 384-387.

* cited by examiner

ELECTRO-OPTIC EFFECT BASED OPTICAL VOLTAGE TRANSFORMER

FIELD OF THE INVENTION

This invention relates to electrical power equipment technical field, especially to an electro-optic effect based optical voltage transformer.

BACKGROUND OF THE INVENTION

High-voltage power transformer is the most basic measurement equipment which provides measurement, control and relay protection for the power system. With the continuous improvement of the power system voltage levels, the traditional electromagnetic inductive or capacitive voltage divider transformer is difficult to overcome many limitations due to its restrictions of sensing mechanism. Optical voltage transformer is a novel transformer which performs voltage measurement using photonics technology and optical fiber sensing technology. Compared with the traditional transformers, in the optical voltage transformer high voltage signal is transmitted to the secondary equipment via optical fiber, so that insulation is greatly simplified, bandwidth is high, dynamic range is wide and it is non-magnetic saturation, lightweight and easy to install, therefore the optical voltage transformer has a very broad application prospects in the power system.

Internationally, companies such as Switzerland ABB, France Alstom, Canada Nxtphase, etc., have put optical voltage transformers to the market, and their principles of work are all using the longitudinal modulation structure based on Pockels electro-optic effect. In 1997, ABB Power T&D company reported 115 kV~550 kV Combined Optical Voltage/current transformers, whose measurement accuracy reached IEC 0.2 level. In 1997, the French Alstom reported 123 kV~765 kV Combined Optical Voltage/current transformers whose measurement accuracy can be up to 0.2% and multiple products have been linked to network to operate in Europe and North America. In 2003, Canada Nxtphase reported 121 kV 550 kV optical voltage transformer whose measurement accuracy can be up to IEC 0.2 level and IEEE 0.3 level. In China, some universities such as Tsinghua University, Huazhong University of Science and Technology, etc and many enterprises such as 26th Institute of China Electronics Technology Group Corporation, China Electric Power Research Institute, Shanghai Transformer Factory, etc have engaged in this research successively since 1992, and now many types of optical voltage transformer prototype have been developed but the overwhelming majority of them are limited to laboratory phase.

Currently, most of the existing optical voltage transformers have the problems of variation with temperature of the light source light-emitting wavelength and instability of output power; the existing optical voltage transformers also have the problems of large size, heavy weight, high cost, the phenomenon of partial discharge and withstanding voltage, and the additional insulation design is required, therefore the hidden dangers due to pressure, humidity and other factors are increased, and the long-term safety and reliability can not be ensured well; in the bonding process, the multiple discrete optical components will inevitably produce micro outward movement during the curing process, which affecting the accuracy of azimuth; and the follow-up electronic circuits will directly bring error to the optical signal due to the drift caused by temperature changes, which reduces the stability of the system; in addition, as far as modulation scheme is concerned, compared with horizontal modulation, longitudinal modulation optical voltage transformers also have the problems of high cost of insulation under high pressure, out of proportion between the output signal and the electric field and difficult signal demodulation.

SUMMARY OF THE INVENTION

The technical problem solved in this invention is: in order to overcome the shortcomings of the existing technology, an electro-optic effect based optical voltage transformer is provided, so that the light source center wavelength drift is effectively controlled, the optical power fluctuations caused by factors such as the optical fiber vibration are eliminated, and the stability and reliability of the optical system and the accuracy of the data are improved.

The second technical problem solved in this invention is: in order to solve the problems of the existing optical voltage transformer such as large size, heavy weight, high cost, etc., an optical voltage transformer integrated in GIS cavity is provided which has small size, light weight, good shielding effect and flexible application.

The third technical problem solved in this invention is: a tank-type single-phase optical voltage transformer is provided which has small size, light weight, good shielding effect and flexible application.

The fourth technical problem solved in this invention is: a tank-type three-phase optical voltage transformer is provided which has small size, light weight, good shielding effect and flexible application.

The fifth technical problem solved in this invention is: a suspension electrode type optical voltage transformer is provided which has small size, light weight, good shielding effect and flexible application.

The sixth technical problem solved in this invention is: the phenomenon of partial discharge and problem of withstanding voltage caused by the subsidiary supports are eliminated, the hidden dangers are decreased, the system complexity is simplified, the installation and maintenance are easy and the compressive strength and insulation properties of the GIS system are ensured.

The technical solutions used in this invention are as follows:

An electro-optic effect based optical voltage transformer, is characterized in that it comprises an optical voltage sensor head (1) and an electrical unit (16); the electrical unit (16) comprises an optical closed-loop feedback control unit (2) and a signal processing unit (3); the optical closed-loop feedback control unit (2) is connected to the optical voltage sensor head (1) by optical fiber and the optical voltage sensor head (1) is connected to the signal processing unit (3) by optical fiber; the optical closed-loop feedback control unit (2) provides a light source with stable output power, and this stable light source is transmitted to the optical voltage sensor head (1) by optical fiber; the signal processing unit (3) processes the optical signal detected and output by the optical voltage sensor head (1) and demodulates the measured voltage.

The optical voltage sensor head (1) comprises a first optical fiber collimator (41), a polarizer (5), a ¼ wave plate (6), a BGO crystal (7), an analyzer (8), a second optical fiber collimator (42) and a third optical fiber collimator (43); the first optical fiber collimator (41) is connected to one end of the polarizer (5), the other end of the polarizer (5) goes through the ¼ wave plate (6) and the BGO crystal (7) successively and then is connected to the analyzer (8), after the analyzer (8) it is divided into two paths, one path of reflection end goes through the second optical fiber collimator (42) and then is output by the optical fiber to the signal processing unit (3), the other path of transmission end goes through the third optical fiber collimator (43) and then is output by the optical fiber to the signal processing unit (3).

The optical closed-loop feedback control unit (2) includes an SLD light source (9), a Lyot depolarizer (10), a coupler (11), a first detector (121) and a drive circuit (13); the optical signal generated by the SLD light source (9) goes through the Lyot depolarizer (10) and is transformed into low-polarized light, then it is output by the coupler (11) and transmitted to the optical voltage sensor head (1) by the optical fiber; meanwhile, the output of the coupler (11) goes through the first detector (121) and the optical signal is transformed into an electrical signal and then it is transmitted to the drive circuit (13), the drive circuit (13) determines whether the requirement of the output optical power is met, calculates and adjusts the drive circuit parameters, and then feedback them to the SLD light source (9), making the SLD light source (9) output stable optical power, so that the light source output power output by the coupler (11) to the optical voltage sensor head (1) is stable.

The signal processing unit (3) includes a second detector (122), a third detector (123) and a signal demodulation circuit (15); the second detector (122) and the third detector (123) transform respectively the two paths of optical signal emitted by the optical voltage sensor head (1) into electrical signal and then transmit them to the signal demodulation circuit (15), the signal demodulation circuit (15) calculates the sliding averages of the two detecting channels, i.e., the second detector (122) and the third detector (123), respectively, and then calculates the ratio of AC to DC, weighted averages the two paths of detecting signal, so that the two voltage amplitudes go to balance, and finally generates frame with the resulting voltage values according to communication protocol and transmits them through the serial port.

An optical voltage transformer integrated in a GIS cavity is characterized in that: it includes the optical voltage sensor head (1) and the electrical unit (16) mentioned above, and it also includes a GIS cavity (18), a high-voltage bus (19), a probe (20), a probe support (21), a gas-tight optical fiber extractor (22) and an optical fiber (17); the high-voltage bus (19) is placed in the GIS cavity (18); on the bottom of the GIS cavity (18) there is a mounting hole for setting the optical voltage sensor head (1), the probe (20) and the probe support (21), the optical voltage sensor head (1), the probe (20) and the probe support (21) can be installed in the GIS cavity (18) through the mounting hole, the gas-tight optical fiber extractor (22) outside the bottom of the GIS cavity (18) is sealed-connected with the bottom of the GIS cavity (18) at the place of the mounting hole so as to seal the mounting hole; the bottom of the probe support (21) is fixed-connected with the top of the gas-tight optical fiber extractor (22), the probe (20) is set on the probe support (21), the optical voltage sensor head (1) is placed on the top surface of the probe (20), there is a distance between the optical voltage sensor head (1) and the high-voltage bus (19); the optical fiber (17) connected with the optical fiber sensor head (1) is extracted by the gas-tight optical fiber extractor (22) to the electrical unit (16).

A tank-type single-phase optical voltage transformer is characterized in that: it comprises the optical voltage sensor head (1) and the electrical unit (16) mentioned above, it also comprises an insulator (29), a high-voltage electrode (30), a tank (31), a probe (20), a probe support (21), an optical fiber (17) and a gas-tight optical fiber extractor (22); one end of the high-voltage electrode (30) is placed outside the tank (31), the other end of the high-voltage electrode (30) is placed in the tank (31) through the insulator (29); on the bottom of the tank (31) there is a mounting hole for setting the optical voltage sensor head (1), the probe (20) and the probe support (21), the optical voltage sensor head (1), the probe (20) and the probe support (21) can be installed in the tank (31) through the mounting hole, the gas-tight optical fiber extractor (22) outside the tank (31) is sealed-connected with the bottom of the tank (31) at the place of the mounting hole so as to seal the mounting hole; there is a distance between the high-voltage electrode (30) and the optical voltage sensor head (1); the bottom of the probe support (21) is fixed-connected with the top of the gas-tight optical fiber extractor (22), the probe (20) is set on the probe support (21), the optical voltage sensor head (1) is placed at the location on the top surface of the probe (20) corresponding to the other end of the high-voltage electrode (30); the optical fiber (17) connected with the optical fiber sensor head (1) is extracted by the gas-tight optical fiber extractor (22) to the electrical unit (16).

A tank-type three-phase optical voltage transformer is characterized in that: it comprises the optical voltage sensor head (1) and the electrical unit (16) mentioned above, it also comprises an insulator (29), a tank (31) and an optical voltage transformer unit; the insulator (29) is set on one end of the tank (31); the optical voltage sensor head (1) is included in the optical voltage transformer unit, the optical voltage transformer unit has three sets, i.e. A, B, C phase, respectively, is set in the tank (31), each set of the optical voltage transformer unit includes a distance-expanded conductor (35), a high-voltage electrode (30), a shielding cylinder (34), an optical voltage sensor head (1), a probe (20), an optical fiber (17), a gas-tight optical fiber extractor (22) and a probe support (21);

one end of the distance-expanded conductor (35) is fixed-connected with the insulator (29), the other end is fixed-connected with the high-voltage electrode (30); the shielding cylinder (34) is set opposite to the insulator (29) in the bottom of the tank (31); the free end of the high-voltage electrode (30) extends into the shielding cylinder (34);

on the bottom of the tank (31) there is a mounting hole for setting the optical voltage sensor head (1), the probe (20) and the probe support (21), the optical voltage sensor head (1), the probe (20) and the probe support (21) can be installed in the tank (31) through the mounting hole, the gas-tight optical fiber extractor (22) outside the bottom of the tank (31) is sealed-connected with the bottom of the tank (31) at the place of the mounting hole so as to seal the mounting hole; the probe (20) and the optical voltage sensor head (1) are set in the shielding cylinder (34); the bottom of the probe support (21) is fixed-connected with the top of the gas-tight optical fiber extractor (22), the probe (20) is set on the probe support (21), the optical voltage sensor head (1) is placed at the location on the top surface of the probe (20) corresponding to the other end of the high-voltage electrode (30), there is a distance between the high-voltage electrode (30) and the optical voltage sensor head (1); the optical fiber (17) connected with the optical fiber sensor head (1) is extracted by the gas-tight optical fiber extractor (22) to the electrical unit (16). A suspension electrode type optical voltage transformer is characterized in that: it comprises the optical voltage transformer (1) and the electrical unit (16) mentioned above, it also comprises an insulator (29), a high-voltage electrode (30), a transformer casing (36), a suspension electrode (37), a sealing ring (38), a ground pole (39), an insulating support (40), a transformer external housing (44) and an optical fiber (17); the insulator (29) is fixed-connected to one end of the transformer casing (36), the outward face of the other end of the transformer casing (36) is fixed-connected to the transformer external housing (44); a ground pole (39) is set on the transformer external housing (44); the sealing ring (38) is set on connection of the transformer casing (36) and the transformer external housing (44); one end of the high-voltage electrode (30) extends into the transformer casing (36) by the insulator (29) and is fixed-connected with the insulator (29); the suspension electrode (37) is sealed-fixed on the joint of the transformer casing (36) and the transformer external housing (44) by the insulating support (40), and its both ends extend into the transformer casing (36) and the transformer external housing (44), respectively; the optical voltage sensor head (1) is set on the inner bottom of the transformer external housing (44), the optical fiber (17) connected with the optical voltage sensor head (1) is extracted to the transformer external housing (44), and then to the electrical unit (16) by the transformer external housing (44).

The optical fiber extracting method of the gas-tight optical fiber extractor (22) uses optical fiber metallized packaging technology; the gas-tight optical fiber extractor (22) includes a metallized fiber (24), a metal tube (25), a sealing ring (26), a fiber extracting flange (27) and a fiber through hole (28); the fiber through hole (28) is on the fiber extracting flange (27), the metal tube (25) goes through the fiber through hole (28) and it is sealed between the metal tube (25) and the fiber through hole (28); the metallized fiber (24) goes through the metal tube (25) and it is sealed between the metallized fiber (24) and the metal tube (25); the sealing ring (26) is embedded on the sealing surface of the fiber extracting flange (27) and circles the fiber through hole (28).

It also comprises an optical fiber protection box (23), the gas-tight optical fiber extractor (22) is extracted to the optical fiber protection box (23) and then to the electrical unit (16).

It also comprises an optical fiber protection box (23), the optical fiber (17) connected with the optical voltage sensor head (1) is extracted from the transformer external housing (44) and then is led to the electrical unit (16) through the optical fiber extracting hole (45) in the optical fiber protection box (23); and/or it comprises a GIS cavity of the transformer station, the GIS cavity of the transformer station is grounded, the transformer casing (36) is connected to the GIS cavity of the transformer station, and the GIS cavity of the transformer station is filled with $SF_6$ insulating gas; and/or the ground pole (39) is grounded in maintenance.

It also comprises an inflation-and-outlet valve (32), the inflation-and-outlet valve (32) is connected to the tank (31), and/or it comprises an explosion-proof membrane (33), the explosion-proof membrane (33) is connected to the tank (31).

The insulator (29) is fixed on top of the tank (31), the probe (20) is installed on top of the probe support (21), the optical voltage sensor head (1) is set in the center of the top surface of the probe (20); and/or the tank (31) is filled with $SF_6$ insulating gas; and/or the distance between the high-voltage electrode (30) and the optical voltage sensor head (1) can be adjusted according to the different voltage levels so as to improve the testing accuracy.

The distance between the high-voltage bus (19) and the optical voltage sensor head (1) can be adjusted by adjusting the height of the probe support (21) so as to improve the testing accuracy; and/or the optical voltage sensor head (1) is set in the center of the top surface of the probe (20); and/or the GIS cavity (18) is filled with $SF_6$ insulating gas.

The insulator (29), the distance-expanded conductor (35) and the high-voltage electrode (30) are equipotential, the shielding cylinder (34) and the tank (31) have equipotential connection to the ground electrode; and/or the distance-expanded conductor (35) can be adjusted, the high-voltage electrode (30) is fixed on the distance-expanded conductor (35), through adjusting the distance-expanded conductor (35), the high-voltage electrode (30) can be adjusted to go to or away the center of the cylindrical surface of the shielding cylinder (34); and/or the shielding cylinder (34) uses the material with the resistivity of less than 90 and the linear expansion coefficient of less than $24.0 \times 10^{-6}/K$.

The connection between the optical voltage sensor head (1) and the probe (20) surface is bonding.

The optical voltage sensor head (1) is in the primary system of electric power system, and the electrical unit (16) is in the secondary system of electric power system.

The BGO crystal (7) is on the ground electrode of electric field in the primary system of electric power system, and the contact surface of the BGO crystal (7) with the ground electrode is plated a chromium-gold film; and/or the polarizer (5) and the ¼ wave plate (6) are realized by integral machining technology.

The insulator (29) is a basin insulator; and the optical fiber (17) is single-mode fiber.

The beneficial results of this invention compared with the prior art are as follows:

(1) In this invention, an optical closed-loop feedback control unit is added in the electrical unit of the optical voltage transformer, so that the output power of the light source (e.g. SLD light source) can be more stable, the SLD light source center wavelength drift is controlled effectively, the output power coastdown caused by aging of the SLD light source is prevented, the optical power fluctuation of the optical polarization caused by factors such as temperature and optical fiber vibration, etc., is eliminated, and stability and reliability of the optical system and accuracy of data are improved.

(2) In this invention, a Lyot depolarizer is added in the optical closed-loop feedback control unit, so the optical power fluctuation of the optical polarization caused by factors such as temperature and optical fiber vibration, etc., can be eliminated, which is good for further improving the stability and reliability of the optical system.

(3) In this invention, the AC and DC values in the dual-optical signal output by the two detectors in the signal processing unit are acquired by software in the signal demodulation circuit, so that the signal demodulation circuit is simplified, the influence of the temperature drift and bandwidth limit on the analog circuit is reduced and the accuracy of data is improved.

(4) In this invention, a BGO crystal is set in the optical voltage sensor head, so that the optical voltage sensor head is a horizontal modulation structure based on the Pockels electro-optic effect, the horizontal modulation optical voltage transformers have advantages such as low insulation cost under high voltage, the output signal being proportional to the electric field and the signal being easy to demodulate.

(5) In this invention, in addition to an optical voltage sensor head and an electrical unit, components comprising a GIS cavity, a high-voltage bus, a probe, a probe support, an optical fiber, a gas-tight optical fiber extractor, etc are used to compose an optical voltage transformer integrated in a GIS cavity; components comprising an insulator, a high-voltage electrodes, a tank, a probe, a probe support, an optical fiber, a gas-tight optical fiber extractor, etc are used to compose a tank-type single-phase optical voltage transformer; components comprising an insulator, a tank, three sets of optical voltage transformer unit, etc are used to compose a tank-type three-phase optical voltage transformer. The optical voltage sensor head in the optical voltage transformer integrated in the GIS cavity, the tank-type single-phase optical voltage transformer and the tank-type three-phase optical voltage transformer are directly placed in the GIS cavity or the tank through the probe, the probe support and the gas-tight optical fiber extractor, which has advantages of flexible application, small size, light weight, low cost, and good shielding effect.

(6) In this invention, there is no need for any framework support between the high-voltage bus (or high-voltage electrode) and the optical voltage sensor head, so that the design structure is simple and the phenomenon of partial discharge and withstanding voltage problem caused by the subsidiary supports are eliminated.

(7) In this invention, the SF6 gas in the GIS cavity (or tank) is directly used to insulate between the high-voltage bus (or high-voltage electrode) and the optical voltage sensor head, without the need for additional insulation design, so that the hidden dangers due to pressure, humidity and other factors are decreased, and the system complexity is simplified.

(8) In this invention, the height between the high-voltage bus (or high-voltage electrode) and the optical voltage sensor head can be adjusted according to the different voltage levels, so that the design is flexible and simple and it is easy to install and maintain.

(9) In this invention, the optical fiber extracting method of the gas-tight optical fiber extractor uses the optical fiber metallized packaging technology, which avoids the gas leakage of the optical fiber extracting end caused by the pressure difference between the GIS cavity (or tank) and the external environment and ensures the compressive strength and insulation property of the GIS system.

(10) In this invention, in addition to the optical voltage sensor head and the electrical unit, components comprising an insulator, a high-voltage electrode, a transformer casing, a suspension electrode, a ground pole, an insulating support, a transformer external housing, etc are used to compose a suspension electrode type optical voltage transformer. the addition of the transformer casings enhances the electromagnetic shielding; the suspension electrode is added to transform the high voltage of one side of the high-voltage electrode into the low voltage of the suspension electrode, so that a complete separation between high voltage and low voltage is achieved and security is greatly improved; a ground pole is added to the transformer external housing, so the ground pole is impending during normal operation; the optical voltage sensor head is placed on the inner bottom of the transformer external housing, the transformer external housing is completely isolated from the insulating gas chamber, so the optical components are not affected by the insulating gas.

(11) In the maintenance and inspection of the suspension electrode type optical voltage transformer of this invention, the ground pole is grounded so as to ensure the safety of person and equipment.

(12) An optical fiber protection box is added in this invention, which can protect the optical fiber from damage.

(13) The shielding cylinder in the tank-type three-phase optical voltage transformer of this invention is made of material with resistivity of less than 90 and linear expansion coefficient of less than $24.0 \times 10^{-6}$/K, e.g. aluminum alloy, copper, etc which is non-magnetic and has good conductivity, which ensures good electrical shielding of the shielding cylinder and equipotential relationship between the shielding cylinder and the ground electrode.

(14) In this invention, chromium-gold film is plated on the contacting face of the BGO crystal and the ground electrode, which ensures good contact of the BGO crystal and the ground electrode and more uniform electric field distribution on the BGO crystal.

(15) In this invention, the ¼ wave plate and the polarizer of the optical voltage sensor head are realized by integral machining technologically, which greatly reduces the thickness of the ¼ wave plate, thereby weakens the impact of the temperature property of the ¼ wave plate on the system.

DETAILED DESCRIPTION OF THE PREFERRED EMBODIMENTS

In order to make the technical problems solved by this invention, the technical solutions and the beneficial effect more clearly and easy to understand, further detailed description of this invention will be made combined with drawings and embodiments. It should be understood that the detailed embodiments described here are only used to explain this invention but not to limit this invention.

The optical voltage transformer described in this invention uses Pockels effect to accurately measure voltage or electric field.

Figure 1:
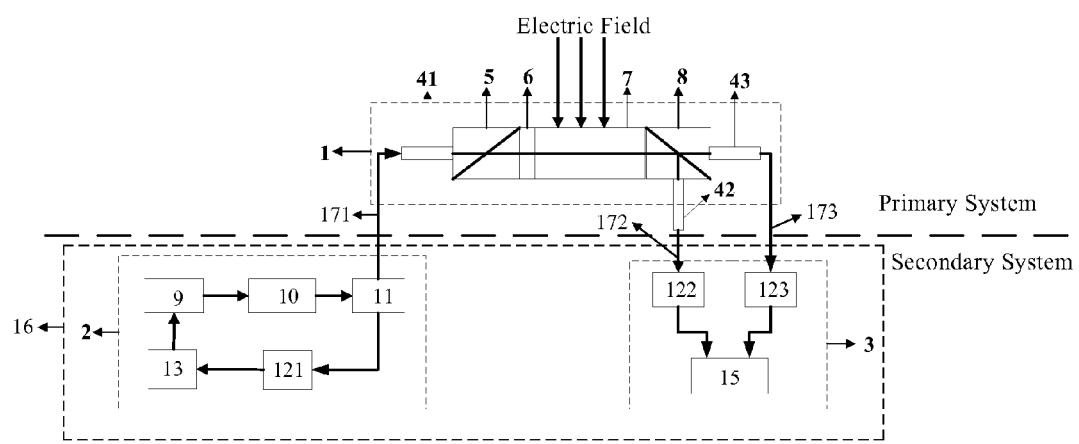
FIG. 1 shows the schematic structure of the electro-optic effect based optical voltage transformer of this invention.

FIG. 1 shows the schematic structure of the electro-optic effect based optical voltage transformer of this invention, which includes an optical voltage sensor head 1 and an electrical unit 16, the electrical unit 16 includes an optical closed-loop feedback control unit 2 and a signal processing unit 3, the electrical unit 16 is connected to an external back-end host computer or a combination unit.

The optical voltage sensor head 1 is in the primary system of electric power system, and the electric power system refers to the system used for power generation, transmission, distribution and consumption, which is made up of phases of power generation, power transformation, power transmission, power distribution and power consumption, etc. The system made up of primary equipments, i.e. the power generation and distribution equipments, e.g. power generators, transformers and circuit breakers, etc, is the primary system. The system made up of auxiliary equipments, e.g. relay protection, automatic safety devices, dispatching automatization, communications, etc is the secondary system. The electrical unit 16 is in the secondary system of the electric power system. Therefore, the electro-optic effect based optical voltage transformer of this invention is a passive optical voltage transformer.

As is shown in FIG. 1, in this invention, the optical voltage sensor head 1 is a horizontal modulation structure based on the Pockels electro-optic effect, which includes a first optical fiber collimator 41, a polarizer 5, a ¼ wave plate 6, a BGO crystal 7, an analyzer 8, a second optical fiber collimator 42 and a third optical fiber collimator 43, the first optical fiber collimator 41 is connected to one end of the polarizer 5, the other end of the polarizer 5 goes through the ¼ wave plate 6 and the BGO crystal 7 successively and then is connected to the analyzer 8, after the analyzer 8 it is divided into two paths, one path of reflection end is output by the second optical fiber collimator 42 and the other path of transmission end is output by the third optical fiber collimator 43. The first optical fiber collimator 41, the second optical fiber collimator 42 and the third optical fiber collimator 43 are bonded to the input end of the polarizer 5, the reflection end and the transmission end of the analyzer 8, respectively.

The operation principle of the optical voltage sensor head 1 is: the incident light from the optical closed-loop feedback control unit 2 goes through the first optical fiber 171, and it is transformed into parallel light by the first optical fiber collimator 4, then it is transformed into linearly polarized light by the polarizer 5, and then it goes through the ¼ wave plate 6 to produce two beams of perpendicular linearly polarized light whose directions of vibration are orthogonal and phase difference is 90 degree, because of the action of the Pockels effect of the BGO crystal 7, after the two beams of linearly polarized light are transmitted through the BGO crystal 7, a phase difference associated with the applied electric field is produced, under the action of the analyzer 8, the two beams of linearly polarized light produce interference and phase detection is changed into light detection, and finally two paths of the light emitted by the BGO crystal 7 go through the analyzer 8 and phase change is switched into light intensity change, then they are transmitted by the second optical fiber collimator 42 and the third optical fiber collimator 43 through the second optical fiber 172 and the third optical fiber 173, respectively, to the signal processing unit 3, and now the electric field applied on primary system can be detected using the Pockels electro-optic effect.

In this invention, the BGO crystal 7 is located on the ground electrode of the electric field in the primary system of electric power system, and the contact face of the BGO crystal 7 and the ground electrode is plated with chromium-gold film, thereby the good contact of the BGO crystal with the ground electrode can be ensured and the electric field distribution on the BGO crystal is more uniform.

The polarizer 5 and the ¼ wave plate 6 are realized by integral machining technologically, which greatly reduces the thickness of the ¼ wave plate, thereby weakens the impact of the temperature property of the ¼ wave plate on the system.

As shown in FIG. 1, the center wavelength of the light source is made stable by the optical closed-loop feedback control unit 2, which is output to the optical voltage sensor head 1 via the first optical fiber 171; the signal processing unit 3 processes the optical signal output by the optical voltage sensor head 1 and demodulates the measured voltage. In this invention, an optical closed-loop feedback control unit 2 is added in the electrical unit 16, so that the output power of the SLD light source is more stable, the phenomenon of the center wavelength drift of the SLD light source can be controlled effectively, and the output power coastdown caused by aging of the SLD light source can be prevented.

As shown in FIG. 1, the optical closed-loop feedback control unit 2 includes a SLD light source 9, a Lyot depolarizer 10, a coupler 11, a first detector 121 and a drive circuit 13, the SLD light source 9, the Lyot depolarizer 10, the coupler 11, the first detector 121 and the drive circuit 13 are connected end-to-end in turn to form a circle, and the coupler 11 is connected to the first optical fiber collimator 41 by the first optical fiber 171. The light produced by the SLD light sources 9 is transformed into a low-polarized light by the Lyot depolarizer 10, then it goes through the coupler 11 and is transmitted to the optical voltage sensor head 1 via the first optical fiber 171; meanwhile the output of the coupler 11 is transmitted to the drive circuit 13 after the first detector 121 transforms optical signal into electrical signal, and the drive circuit 13 determines whether the requirement of the light power output is met, calculates and adjusts the drive circuit parameters, feeds it back to the SLD light source 9, the SLD light source 9 is made to output the stable optical power, so that the light source output power output by the coupler 11 to the optical voltage sensor head 1 is stable. In this invention, a Lyot depolarizer is added in the optical closed-loop feedback control unit 2, the optical power fluctuation of the optical polarization caused by factors such as temperature, optical fiber vibration, etc., is eliminated, which is conductive to stability and reliability of the optical system.

Figure 2:
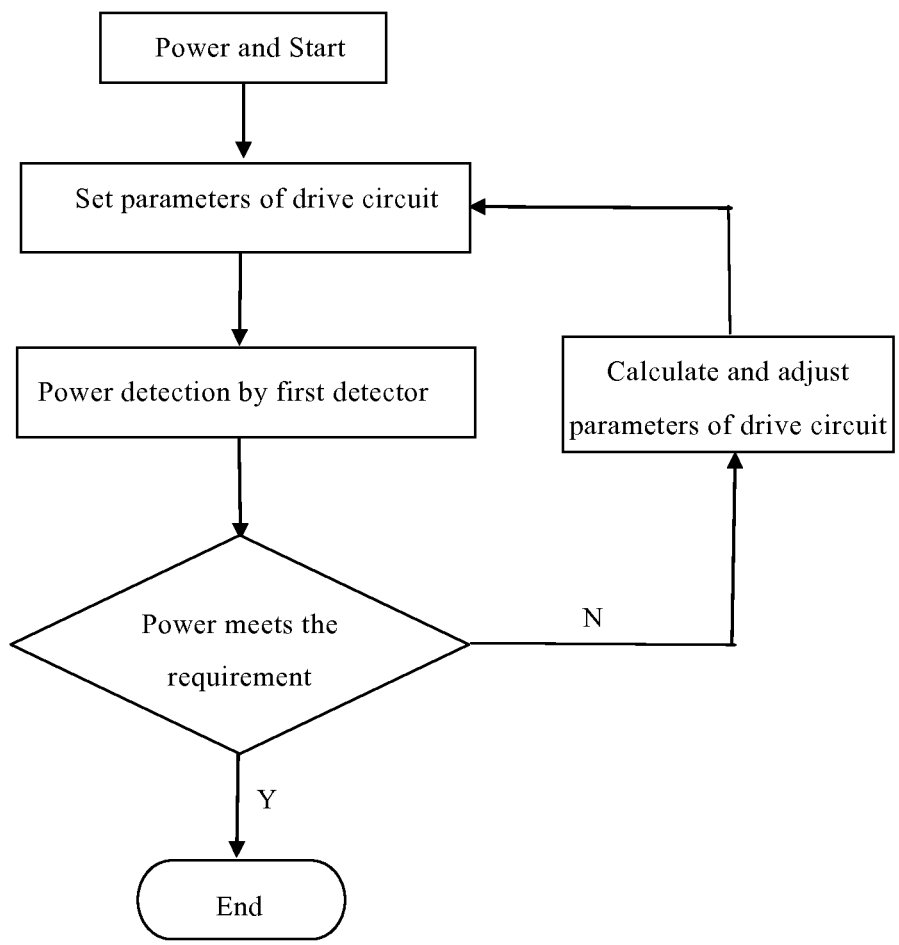
FIG. 2 shows the work flow chart of the drive circuit in this invention.

As shown in FIG. 2, the workflow of the drive circuit 13 is: after the drive circuit is powered, the SLD light source 9 emits light, with the environmental temperature change and the temperature increase of the SLD light source 9 tube core caused by emitting, the instability of the optical power of the SLD light source 9 leads to the instability of the center wavelength, and finally influences the measurement accuracy of the optical voltage transformer, the first detector 121 measures the optical power to see whether it meets the requirement, if the requirement is not met, then the optical power of the SLD light source 9 can be adjusted into the required range by adjusting the drive current, thereby enhancing the optical power and the stability and reliability of the center wavelength.

As shown in FIG. 1, the signal processing unit 3 includes a second detector 122, a third detector 123 and a signal demodulation circuit 15, the second optical fiber collimator 42 is connected to the signal demodulation circuit 15 by the second detector 122, the third fiber collimator 43 is connected to the signal demodulation circuit 15 by the third detector 123. The second detector 122 and the third voltage detector 123 transform the two paths of optical signal emitted by the optical voltage sensor head 1 into electrical signal, respectively, then summarize and transmit them to the signal demodulation circuit 15, the signal demodulation circuit 15 calculates the sliding average of the two detecting channels and the ratio of AC to DC, weighted averages, making the two voltage amplitudes go to balance, and generates frame with the resulting voltage values according to communication protocol and transmits them through the serial port.

Figure 3:
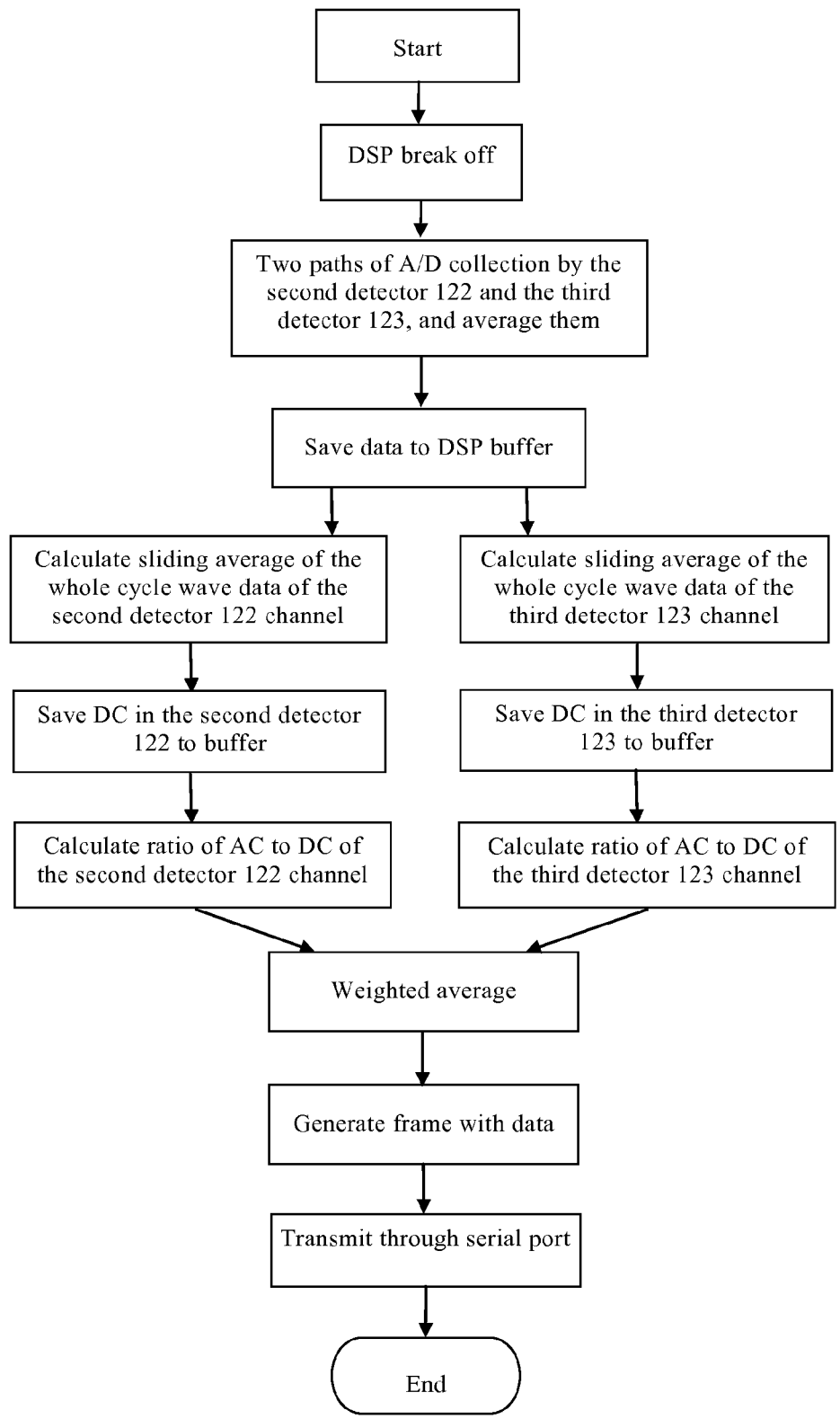
FIG. 3 shows the first work flow chart of the signal demodulation circuit in this invention.

As shown in FIG. 3, the workflow of the signal demodulation circuit 15 is: the signal demodulation circuit 15 produces falling-edge pulses after it is powered, collects the two paths of signal (including DC component and AC component) output by the second detector 122 and the third detector 123, performs AD conversion and then averages and saves them to the buffer, for DC, calculates sliding average of the whole cycle wave data (i.e., obtaining an integral number of cycles of wave for the detected signal) of the two channels separately, then saves the DC components detected by the two channels in the buffer, and calculates the ratio of AC to DC of the two channels detected by the second detector 122 and the third detector 123 (subtracts DC components from the two paths of signal output by the second detector 122 and the third detector 123 respectively, AC components are obtained, and then calculates the ratio of AC to DC), weighted averages them, so that the two paths of amplitudes go to balance, and finally generates frame with the resulting voltage values according to communication protocol and transmits them through the serial port. In this invention, the AC and DC components in the dual-optical signal output by the two detectors in the signal processing unit 3 are acquired by software in the signal demodulation circuit 15, so that the signal demodulation circuit is simplified, the influence of the temperature drift and bandwidth limit on the analog circuit is reduced and the accuracy of data is improved.

Figure 4:
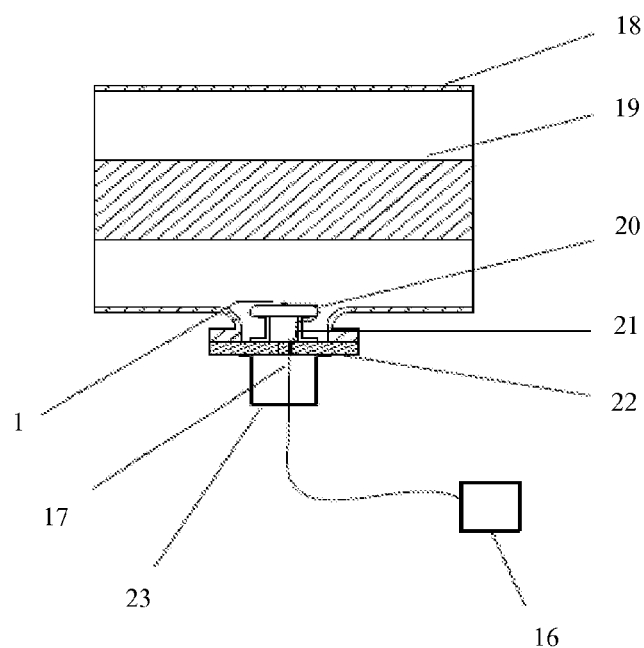
FIG. 4 shows the preferable schematic structure of the optical voltage transformer integrated in a GIS cavity in this invention.

FIG. 4 shows the preferable schematic structure of the optical voltage transformer integrated in a GIS cavity in this invention. The optical voltage transformer integrated in a GIS cavity shown in this embodiment is a electro-optic effect based optical voltage transformer, in addition to an optical voltage sensor head 1 and a electrical unit 16, it also includes a GIS cavity 18, a high-voltage bus 19, a probe 20, a probe support 21, a gas-tight optical fiber extractor 22, an optical fiber 17 and an optical fiber protection box 23. The high-voltage bus 19 is placed in the GIS cavity 18 which is filled with SF6 insulating gas, and the both ends of the high-voltage bus 19 is fixed with the GIS cavity 18 through an insulating layer. On the bottom of the GIS cavity 18 there is a mounting hole, the probe support 21, the probe 20 and the optical voltage sensor head 1 are installed in the GIS cavity 18 in turn through the mounting hole, and then the gas-tight optical fiber extractor 22 outside the GIS cavity 18 is sealed-connected with the bottom of the GIS cavity 18 at the place of the mounting hole so as to seal the mounting hole. The bottom of the probe support 21 is fixed-connected with the top of the gas-tight optical fiber extractor 22 by screws, the probe 20 is fixed on the probe support 21, the optical voltage sensor head 1 is bonded on center of the top surface of the probe 20, there is a distance between the optical voltage sensor head 1 and the high-voltage bus 19; the optical fiber 17 bonded with the optical fiber sensor head 1 is extracted by the probe support 21 and the gas-tight optical fiber extractor 22 which is on the lower end to the optical fiber protection box 23 and then to the electrical unit 16, and the electrical unit 16 is connected to a back-end host computer or a combination unit. The optical fiber 17 is a single-mode fiber and includes a first optical fiber 171, a second optical fiber 172 and a third optical fiber 173.

In FIG. 4:

(1) The optical voltage transformer integrated in a GIS cavity is 220 kV single-phase structure;

(2) The optical voltage sensor head 1 is directly set in the GIS cavity 18;

(3) The distance between the high-voltage bus 19 and the optical voltage sensor head 1 can be adjusted by adjusting the height of the probe support 21 so as to improve testing accuracy. In order to decrease the hidden dangers of partial discharge, voltage breakdown, etc, the high-voltage bus 19 and the probe 20 connected to the optical voltage sensor head 1 are analyzed according to the finite-element method, and based on the analyzing results designs are as follows: the diameter of the high-voltage bus 19 is about 125 mm, the diameter of the GIS cavity 18 is about 334 mm, the distance between the high-voltage bus 19 and the optical voltage sensor head 1 is about 100 mm, there is no any support between the high-voltage bus 19 and the optical sensor head 1 and the distance between them is between 100 mm (if the optical voltage transformer is 110 KV single-phase structure, then the distance from the high-voltage bus 19 to the optical voltage sensor head 1 is about 70 mm). The above sizes are applicable for the 220 kV voltage level, and it needs to analyze and determine again for other voltage level applications.

(4) In order to ensure the compressive strength and insulating property of the GIS cavity 18, it can be concluded through testing that the gas-tight optical fiber extractor 22 can withstand 20 atmosphere pressures, which fully meets the pressure requirement of $SF_6$ gas in the GIS cavity.

In FIG. 4, the optical voltage sensor head 1 and the electrical unit 16 in the optical voltage transformer integrated in the GIS cavity can use the structure shown in FIG. 1, the optical voltage sensor head 1 is in the primary system of electric power system, the optical voltage sensor head 1 is the horizontal modulation structure based on the Pockels electro-optic effect, the electrical unit 16 is in the secondary system of electric power system, the electrical unit 16 includes an optical closed-loop feedback control unit 2 and a signal processing unit 3, the workflow of the drive circuit in the optical closed-loop feedback control unit 2 is shown in FIG. 2, the optical closed-loop feedback control unit 2 is used so that the output power of the SLD light source 9 can be more stable, the SLD light source center wavelength drift is controlled effectively, the output power decrease caused by aging of the SLD light source is prevented, the optical power fluctuation of the optical polarization caused by factors such as temperature and optical fiber vibration, etc., is eliminated, which is conductive to stability and reliability of the optical system. The workflow of the signal demodulation circuit in the signal processing unit 3 is shown in FIG. 3.

Figure 5:
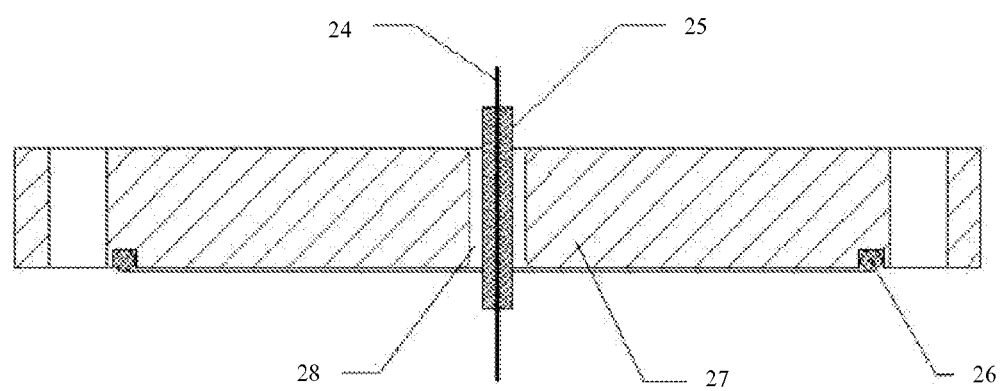
FIG. 5 shows the section view of the gas-tight optical fiber extractor in this invention.

The section view of the gas-tight optical fiber extractor 22 of this invention is shown in FIG. 5. The gas-tight optical fiber extractor 22 includes a metallized fiber 24, a metal tube 25, a sealing ring 26, a fiber extracting flange 27 and a fiber through hole 28; the fiber through hole 28 is on the fiber extracting flange 27, the metal tube 25 goes through the fiber through hole 28 and it is sealed between the metal tube 25 and the fiber through hole 28; the metallized fiber 24 goes through the metal tube 25 and it is sealed between the metallized fiber 24 and the metal tube 25; the sealing ring 26 is embedded on the sealing surface of the fiber extracting flange 27 and circles the fiber through hole 28.

The optical fiber extracting method of the gas-tight optical fiber extractor 22 uses optical fiber metallized packaging technology; the fiber extracting flange 27 in the gas-tight optical fiber extractor 22 is fixed on the bottom flange of the GIS cavity 18, it is airtight by the sealing ring 26 between the fiber extracting flange 27 and the bottom flange, so that the gas-tight optical fiber extractor 22 is seal-connected with the bottom of the GIS cavity 18. The fiber through hole 28 is located in the center of the fiber extracting flange 27, it goes through the bottom flange and is connected with inner of the GIS cavity 18, the tail fiber of the incident optical fiber and the two paths of outgoing optical fiber 7 are performed metallized packaging so that metalized fiber 24 is formed, then a metal tube 25 is socket-connected on the metalized fiber 24, between which it is welded together by metal solder, the metal tube 25 goes through the fiber through hole 28 and the fiber through hole 28 is encapsulating curing by 353ND bicomponent epoxy resin adhesive, so that the 353ND bicomponent epoxy resin adhesive fully fills in the gap of the fiber through hole 28. The 353ND bicomponent epoxy resin adhesive reaches stable state by the structure mentioned above.

The optical voltage transformer integrated in a GIS cavity shown in this embodiment has small size, light weight, low cost and good shielding effect; the phenomenon of partial discharge and problem of withstanding voltage caused by the subsidiary supports are eliminated; the hidden dangers caused by pressure and humidity are decreased and the system complexity is simplified; it can be adjusted according to different voltage levels so that the design is flexible and simple and the installation and maintenance are easy; gas leakage on the optical fiber outlet terminal caused by pressure difference between the GIS cavity and the outside environment can be avoided, so that the compressive strength and insulation properties of the GIS system are ensured.

Figure 6:
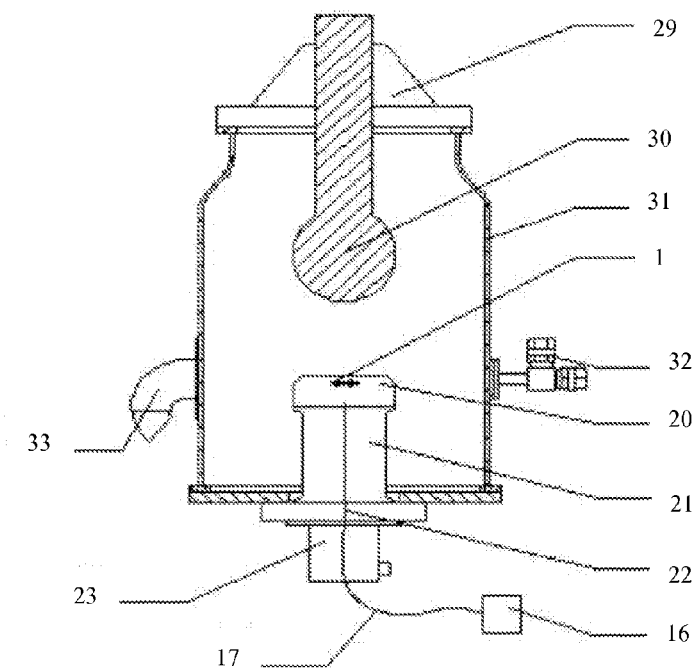
FIG. 6 shows the preferable illustrative structure of the tank-type single-phase optical voltage transformer in this invention.

FIG. 6 shows the preferable illustrative structure of the tank-type single-phase optical voltage transformer of this invention. The tank-type single-phase optical voltage transformer shown in this embodiment is an electro-optic effect based optical voltage transformer. In addition to the optical voltage sensor head 1 and the electrical unit 16, it also comprises an insulator 29, a high-voltage electrode 30, a tank 31, a probe 20, a probe support 21, an optical fiber 17, a gas-tight optical fiber extractor 22, an optical fiber protection box 23, an explosion-proof membrane 33 and an inflation-and-outlet valve 32. The tank 31 is filled with SF6 insulating gas, one end of the high-voltage electrode 30 is placed outside the tank 31, the other end of it is placed in the tank 31 with the insulator 29; the insulator 29 is fixed on the top of the tank 31, the inflation-and-outlet valve 32 is connected to the tank 31, and the explosion-proof membrane 33 is connected to the tank 31.

On the bottom of the tank 31 there is a mounting hole for fixing the optical voltage sensor head 1, the probe 20 and the probe support 21, the optical voltage sensor head 1, the probe 20 and the probe support 21 are installed in the tank 31 through the mounting hole, then the gas-tight optical fiber extractor 22 is sealing connected to the bottom of the tank 31 so that the mounting hole is sealed; the gas-tight optical fiber extractor 22 is outside the tank 31; the bottom of the probe support 21 is fixed-connected with the top of the gas-tight optical fiber extractor 22 by screws, the probe 20 is fixed on the top of the probe support 21, the optical voltage sensor head 1 is bonded on center of the top surface of the probe 20, there is a distance between the optical voltage sensor head 1 and the high-voltage electrode 30; the optical fiber 17 bonded with the optical fiber sensor head 1 is extracted by the probe support 21 and the gas-tight optical fiber extractor 22 which is on the lower end to the optical fiber protection box 23 and then to the electrical unit 16, and the electrical unit 16 is connected to a back-end host computer or a combination unit. The optical fiber 17 is a single-mode fiber and includes a first optical fiber 171, a second optical fiber 172 and a third optical fiber 173. The insulator 29 of this invention is a basin insulator. In this embodiment, the optical voltage transformer is a 220 kV single-phase structure, and the distance from the high-voltage electrode 30 to the optical voltage sensor head 1 is about 100 mm; if the optical voltage transformer is 110 KV single-phase structure, then the distance from the high-voltage electrode 30 to the optical voltage sensor head 1 is about 70 mm. In order to ensure the compressive strength and insulating property of the tank 31, it can be concluded through testing that the gas-tight optical fiber extractor 22 can withstand 20 atmosphere pressures, which fully meets the pressure requirement of $SF_6$ in the tank 31. The material of the probe 20 and the probe support 21 are both metals, e.g. Aluminum alloy, etc.

The optical voltage sensor head 1 is directly placed in the tank 31 by the probe 20 and the probe support 21. There is no need for any framework support between the high-voltage electrode 30 and the optical voltage sensor head 1. The high-voltage electrode 30 and the optical voltage sensor head 1 are insulated from each other by $SF_6$ insulating gas in the tank 31 directly, so no extra insulating design is needed. The height between the high-voltage electrode 30 and the optical voltage sensor head 1 can be adjusted according to different voltage levels. In the optical voltage transformer, the optical fiber extracting method of the gas-tight optical fiber extractor 22 uses optical fiber metallized packaging technology, and the section view of the gas-tight optical fiber extractor 22 is shown in FIG. 5.

The optical voltage sensor head 1 and the electrical unit 16 in the tank-type single-phase optical voltage transformer shown in FIG. 6 can use the structure shown in FIG. 1. The high-voltage electrode 30 generates electric field after it is powered, the optical voltage sensor head 1 detects the phase difference based on Pockels electro-optic effect, and then output it to the electrical unit 16 via optical fiber 17.

The tank-type single-phase optical voltage transformer shown in this embodiment has flexible application, small size, light weight and good shielding effect, the phenomenon of partial discharge and problem of withstanding voltage caused by the subsidiary supports are eliminated, the hidden dangers are decreased and the system complexity is simplified, it can be connected with GIS directly, so that the installation and maintenance are easy and the compressive strength and insulation properties of the GIS system are ensured.

Figure 7:
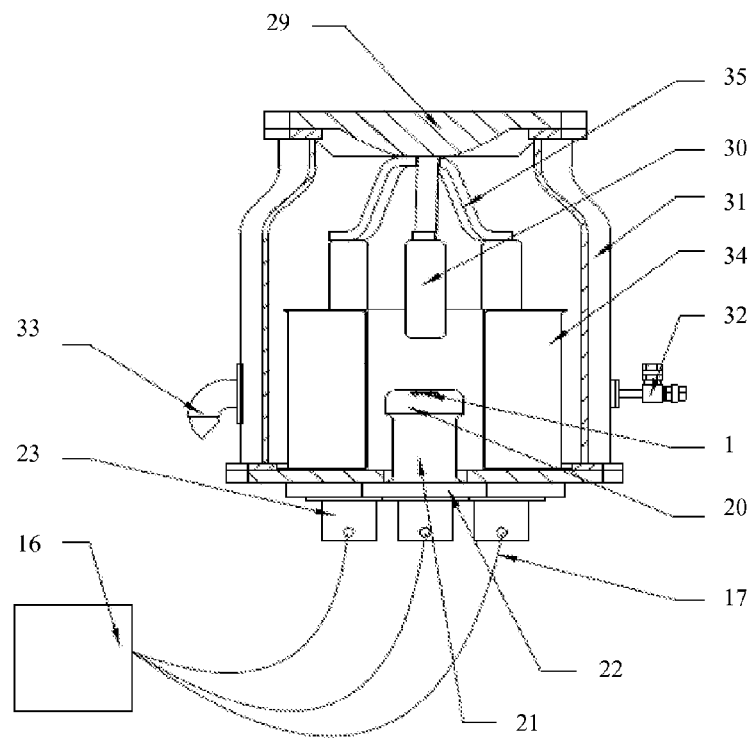
FIG. 7 shows the preferable illustrative structure of the tank-type three-phase optical voltage transform in this invention.

FIG. 7 shows the preferable illustrative structure of the tank-type three-phase optical voltage transform of this invention. The tank-type single-phase optical voltage transformer shown in this embodiment is an electro-optic effect based optical voltage transformer, in addition to the optical voltage sensor head 1 and the electrical unit 16, it comprises an insulator 29, a tank 31, an optical voltage transformer unit, an optical fiver protection box 23, explosion-proof membrane 33 and an inflation-and-outlet valve 32.

The insulator 29 is a basin insulator, it is filled with SF6 insulating gas, and the insulator 29 is set on the upper part of the tank 31. The inflation-and-outlet valve 32 and the explosion-proof membrane 33 are both connected with the tank 31. The optical voltage sensor head 1 is included in the optical voltage transformer unit which has three sets of three phases, i.e. A, B and C, respectively, to be put in the tank 31, each set of the optical voltage transformer unit includes a distance-expanded conductor 35, a high-voltage electrode 30, a shielding cylinder 34, an optical voltage sensor head 1, a probe 20, an optical fiber 17, a gas-tight optical fiber extractor 22 and a probe support 21. The insulator 29 is fixed on top of the tank 31, the high-voltage conducting bus poured in the insulator 29 is connected to the distance-expanded conductor 35 and the high-voltage electrode 30 in turn, the high-voltage electrode 30 is adjusted to go to the center of the cylindrical surface of the shielding cylinder 34 by the distance-expanded conductor 35 and be away from the top surface of the probe 20, one end of the distance-expanded conductor 35 is fixed-connected with the insulator 29, the other end is fixed-connected with the high-voltage electrode 30, wherein the insulator 29, the distance-expanded insulator 35 and the high-voltage electrode 30 are equipotential, the shielding cylinder 34 and the tank 31 are equipotential and are connected with the ground electrode. The shielding cylinder 34 is set opposite to the insulator 29 in the bottom of the tank 31 and the free end of the high-voltage electrode 30 extends into the shielding cylinder 34.

There are three mounting holes in bottom of the tank 31 which are used to fix three sets of optical voltage sensor head 1, probe 20 and probe support 21, this three sets of optical voltage sensor head 1, probe 20 and probe support 21 are installed in the tank 31 through the three mounting holes, respectively, then the three gas-tight optical fiber extractors 22 outside the tank 31 are sealed-connected with the bottom of the tank 31 respectively so as to seal the three mounting holes. The three sets of probe 20 and optical voltage sensor head 1 are set in three shielding cylinders 34. The gas-tight optical fiber extractor 22 is outside the tank 31; the bottom of the probe support 21 is fixed-connected with the top of the gas-tight optical fiber extractor 22, and the probe 20 is installed on top of the probe support 21; the optical voltage sensor head 1 is connected to center of the top surface of the probe 20, and the connection between the optical voltage sensor head 1 and the surface of the probe 20 is bonding; the optical fiber 17 connected with the optical voltage sensor head 1 is extracted by the gas-tight optical fiber extractor 22 to the optical fiber protection box 23 and then to the electrical unit 16, the electrical unit 16 is connected to a back-end host computer or combination unit.

The optical fiber 17 is a single-mode optical fiber comprising a first optical fiber 71, a second optical fiber 72 and a third optical fiber 73. The optical voltage transformer in this embodiment of the invention is a 220 kV three-phase-one-piece structure and the distance from the high-voltage electrode 30 to the optical voltage sensor head 1 is about 100 mm, if the optical voltage transformer is a 110 kV three-phase-one-piece structure, then the distance from the high-voltage electrode 30 to the optical voltage sensor head 1 is about 70 mm. In order to ensure the compressive strength and insulating property of the tank 31, it can be concluded through testing that the gas-tight optical fiber extractor 22 can withstand 20 atmosphere pressures, which fully meets the pressure requirement of $SF_6$ in the tank 31. The material of the probe 20 and the probe support 21 are both metals, e.g. Aluminum alloy, etc.

The optical voltage sensor head 1 is directly placed in the tank 31 with the probe 20 and the probe support 21. There is no need for any framework support between the high-voltage electrode 30 and the optical voltage sensor head 1. The high-voltage electrode 30 and the optical voltage sensor head 1 are insulated from each other by $SF_6$ insulating gas in the tank 31 directly, so no extra insulating design is needed. The height between the high-voltage electrode 30 and the optical voltage sensor head 1 can be adjusted according to different voltage levels. In the optical voltage transformer, the optical fiber extracting method of the gas-tight optical fiber extractor 22 uses optical fiber metallized packaging technology, and the section view of the gas-tight optical fiber extractor 22 is shown in FIG. 5. The distance-expanded conductor 35 can be adjusted, the high-voltage electrode 30 is fixed on the distance-expanded conductor 35, through adjusting the distance-expanded conductor 35, the high-voltage electrode 30 can be adjusted to go to or away the center of the cylindrical surface of the shielding cylinder 34; the shielding cylinder 34 uses the material with the resistivity of less than 90 and the linear expansion coefficient of less than $24.0 \times 10^{-6}$/K.

The optical voltage sensor head 1 and the electrical unit 16 in the tank-type three-phase optical voltage transformer shown in FIG. 7 can use the structure shown in FIG. 1. The high-voltage electrode 30 generates electric field after it is powered, the optical voltage sensor head 1 detects the phase difference based on Pockels electro-optic effect, and then output it to the electrical unit 16 via optical fiber 17.

Figure 8:
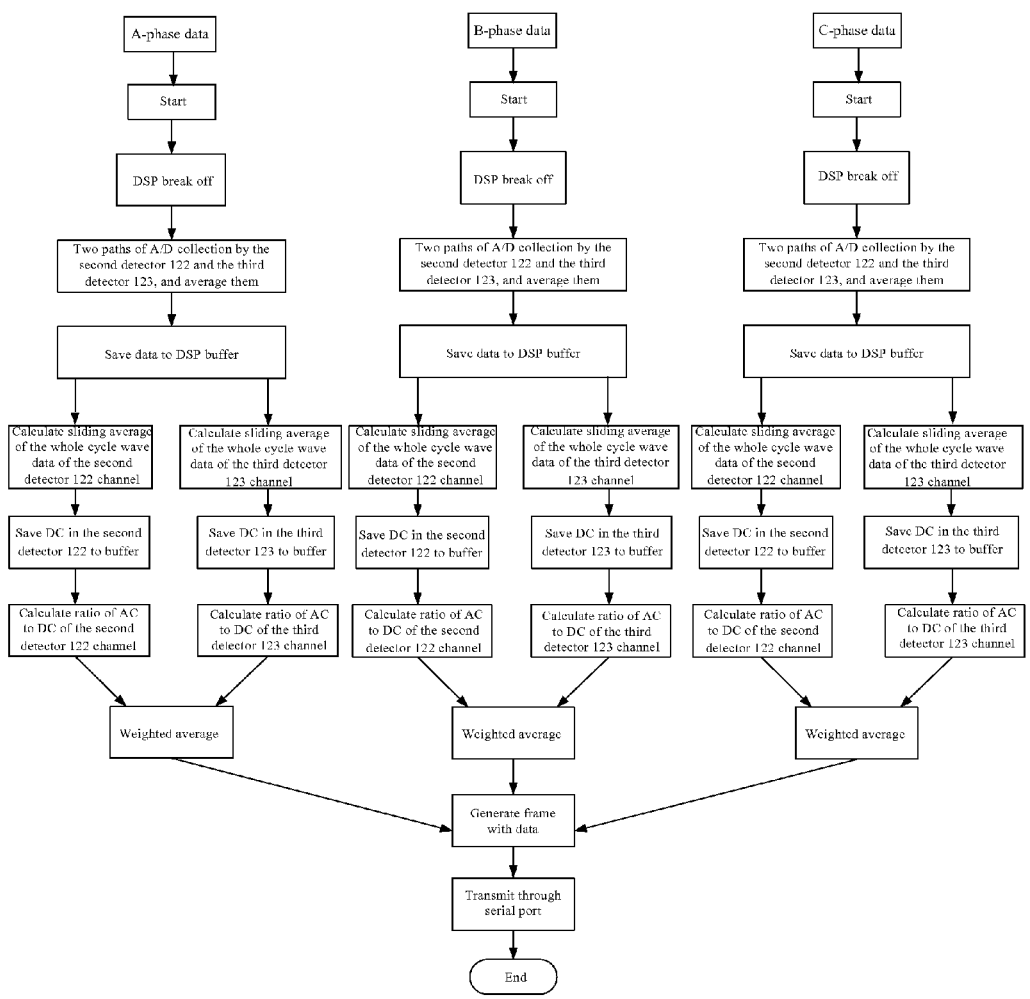
FIG. 8 shows the second work flow chart of the signal demodulation circuit in this invention.

The workflow of the signal demodulation circuit of the tank-type three-phase optical voltage transformer of this embodiment is shown in FIG. 8: in this invention, data of the three phases, i.e. A, B and C perform the same calculation in the same time, the signal demodulation circuit 15 produces falling-edge pulses after it is powered, collects the two paths of signal (including DC component and AC component) output by the second detector 122 and the third detector 123, performs AD conversion and then averages and saves them to the buffer, for DC, calculates sliding average of the whole cycle wave data (i.e., obtaining an integral number of cycles of wave for the detected signal) of the two channels, then saves the DC components detected by the two channels in the buffer, then calculates the ratio of AC to DC of the two channels detected by the second detector 122 and the third detector 123 (subtracts DC components from the two paths of signal output by the second detector 122 and the third detector 123 respectively, AC components are obtained, and then calculates the ratio of AC to DC), makes weighted averages, so that the two paths of amplitudes go to balance, and finally generates frame with the resulting voltage values from the three phases of A, B and C according to communication protocol and transmits them through the serial port.

The tank-type three-phase optical voltage transformer shown in this embodiment of the invention has small size, light weight, low cost and good shielding effect; the phenomenon of partial discharge and problem of withstanding voltage caused by the subsidiary supports are eliminated; without the need for additional insulation design, so that the hidden dangers due to pressure, humidity and other factors are decreased, and the system complexity is simplified; it can be adjusted according to different voltage levels so that the design is flexible and simple and the installation and maintenance are easy.

Figure 9:
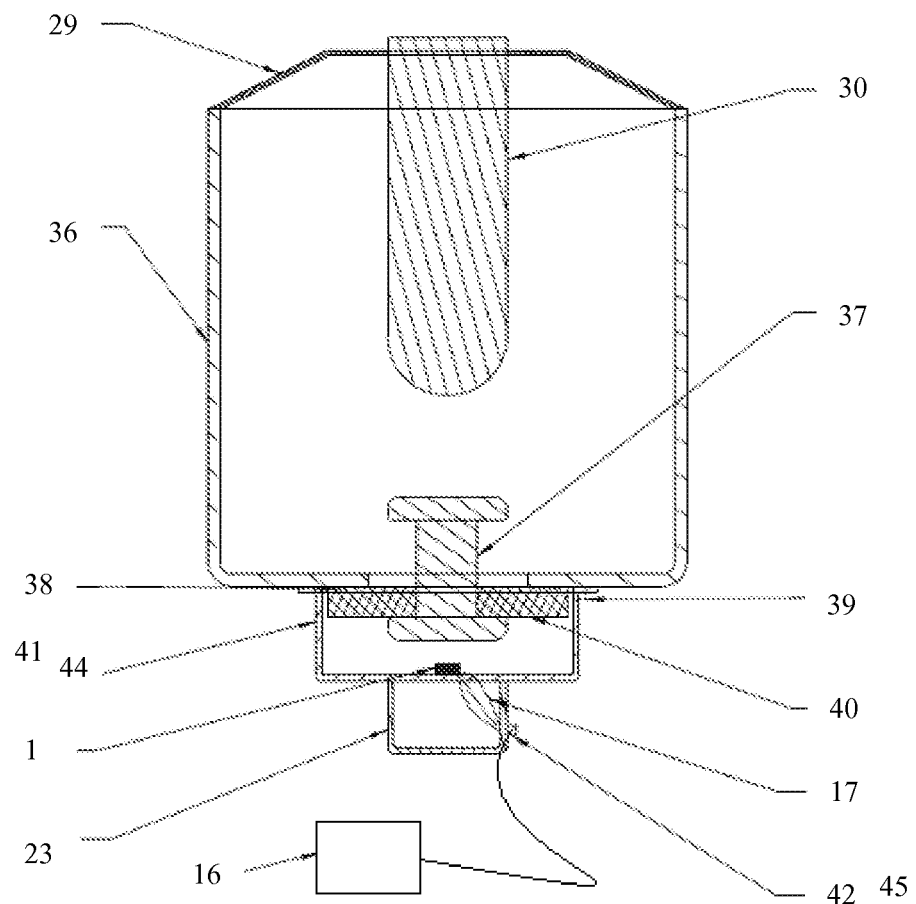
FIG. 9 shows the preferable schematic structure of the suspension electrode-type optical voltage transformer in this invention.

FIG. 9 shows the preferable schematic structure of the suspension electrode type optical voltage transformer of this invention. The suspension electrode type optical voltage transformer shown in this embodiment is an electro-optic effect based optical voltage transformer, in addition to the optical voltage sensor head 1 and the electrical unit 16, it also comprises an insulator 29, a high-voltage electrode 30, a transformer casing 36, a suspension electrode 37, a sealing ring 38, a ground pole 39, an insulating support 40, a transformer external housing 44, an optical fiber 17, an optical fiber protection box 23 and an optical fiber extracting hole 45.

The insulator 29 is fixed-connected to one end of the transformer casing 36, the other end of the transformer casing 36 is fixed-connected from outside to the transformer external housing 44; one end of the high-voltage electrode 30 extends into the transformer casing 36 through the insulator 29 and it is fixed-connected to the insulator 29; the suspension electrode 37 is sealed-fixed at the joint between the transformer casing 36 and the transformer external housing 44 with the insulating support 40, and both ends of the suspension electrode 37 extend into the transformer casing 36 and the transformer external housing 44, respectively, that is, one part of the suspension electrode 37 is placed in the transformer casing 36 and the other part of it is placed in the transformer external housing 44 outside the transformer casing 36; A sealing ring 38 is set at the joint of the transformer casing 36 and the transformer external housing 44, the transformer external housing 44 and the transformer casing 36 are separated by the sealing ring, which ensures that it is airtight in the transformer casing 36. The optical voltage sensor head 1 is placed on the inner bottom of the transformer external housing 44, the optical fiber 17 connected with the optical voltage sensor head 1 is extracted to the electrical unit 16 through the optical fiber extracting hole 45 on the optical fiber protection box 23. A ground pole 39 is set outside the transformer external housing 44, and the ground pole 39 is grounded when maintenance.

Optical fiber 17 is a single-mode optical fiber which includes a first optical fiber 71, a second optical fiber 72 and a third optical fiber 73. The insulator 29 is a basin insulator. The described transform can also include a GIS cavity of transformer station, the GIS cavity of the transformer station is grounded, the transformer casing 36 is connected with the GIS cavity of the transformer station, and the GIS cavity of the transformer station is filled with $SF_6$ insulating gas.

The suspension electrode type optical voltage transformer shown in this embodiment is connected with GIS directly, which has advantages of flexible installation, small size, light weight and low cost, etc; meanwhile, the action of electromagnetic shielding is enhanced; the complete separation between high voltage and low voltage is achieved, so the safety is greatly improved; the addition of ground pole guarantees the safety of persons and equipment; the transformer external housing and the insulating gas chamber are completely separated, so that the optical components are not influenced by the insulating gas; the addition of optical fiber protection box can protect optical fiber from damage; the ¼ wave plate and the polarizer are realized by integral machining technologically, which greatly reduces the thickness of the ¼ wave plate, thereby weakens the impact of the temperature property of the ¼ wave plate on the system.

In this invention, the so-called GIS refers to Gas Insulated Switchgear; the GIS cavity refers to the cavity of the Gas Insulated Switchgear; $SF_6$ refers to sulphur hexafluoride; BGO refers to bismuth germinate $Bi4Ge3O12$; SLD refers to super luminescent diode.

What are not described in details in this invention are well-known technologies in this field.

While specific and preferable embodiments of the disclosed concept have been described in detail above, it will be appreciated by those skilled in the art that this invention is not limited in the described embodiments, various modifications and alternatives in range of the spirit and principle of this invention should all fall in the protection scope of this invention.

The invention claimed is:

1. An optical voltage transformer, comprising:
an optical voltage sensor head; and
an electrical unit including an optical closed-loop feedback control unit and a signal processing unit, wherein:
the optical closed-loop feedback control unit is connected to the optical voltage sensor head by optical fiber and the optical voltage sensor head is connected to the signal processing unit by optical fiber;
the optical closed-loop feedback control unit provides a light source with stable output power, and this stable light source is transmitted to the optical voltage sensor head by optical fiber; and
the signal processing unit processes the optical signal detected and output by the optical voltage sensor head and demodulates the measured voltage;
the optical voltage sensor head comprises a first optical fiber collimator, a polarizer, a ¼ wave plate, a BGO crystal, an analyzer, a second optical fiber collimator and a third optical fiber collimator;
the first optical fiber collimator is connected to one end of the polarizer, the other end of the polarizer goes through the ¼ wave plate and the BGO crystal successively and then is connected to the analyzer, after the analyzer it is divided into two paths, one path of reflection end goes through the second optical fiber collimator and then is output by the optical fiber to the signal processing unit, the other path of transmission end goes through the third optical fiber collimator and then is output by the optical fiber to the signal processing unit.

2. The optical voltage transformer according to claim 1, wherein:
the optical closed-loop feedback control unit includes an SLD light source, a Lyot depolarizer, a coupler, a first detector and a drive circuit;
the optical signal generated by the SLD light source goes through the Lyot depolarizer and is transformed into low-polarized light, then it is output by the coupler and transmitted to the optical voltage sensor head by the optical fiber; and
the output of the coupler goes through the first detector and the optical signal is transformed into an electrical signal and then it is transmitted to the drive circuit (13), the drive circuit determines whether the requirement of the output optical power is met, calculates and adjusts the drive circuit parameters, and then feedback them to the SLD light source, making the SLD light source output stable optical power, so that the light source output power output by the coupler to the optical voltage sensor head is stable.

3. An optical voltage transformer integrated in a GIS cavity, comprising:
the optical voltage sensor head and the electrical unit of claim 2; and
a GIS cavity, a high-voltage bus, a probe, a probe support, a gas-tight optical fiber extractor and an optical fiber, wherein:
the high-voltage bus is placed in the GIS cavity;
on the bottom of the GIS cavity there is a mounting hole for setting the optical voltage sensor head, the probe and the probe support, the optical voltage sensor head, the probe and the probe support can be installed in the GIS cavity through the mounting hole, the gas-tight optical fiber extractor outside the bottom of the GIS cavity is sealed-connected with the bottom of the GIS cavity at the place of the mounting hole so as to seal the mounting hole;
the bottom of the probe support is fixed-connected with the top of the gas-tight optical fiber extractor, the probe is set on the probe support, the optical voltage sensor head is placed on the top surface of the probe, there is a distance between the optical voltage sensor head and the high-voltage bus; and
the optical fiber connected with the optical fiber sensor head is extracted by the gas-tight optical fiber extractor to the electrical unit.

4. The optical voltage transformer according to claim 3, wherein:
the optical fiber extracting method of the gas-tight optical fiber extractor uses optical fiber metallized packaging technology;
the gas-tight optical fiber extractor includes a metallized fiber, a metal tube, a sealing ring, a fiber extracting flange and a fiber through hole;
the fiber through hole is on the fiber extracting flange, the metal tube goes through the fiber through hole and it is sealed between the metal tube and the fiber through hole;
the metallized fiber goes through the metal tube and it is sealed between the metallized fiber and the metal tube; and
the sealing ring is embedded on the sealing surface of the fiber extracting flange and circles the fiber through hole.

5. A tank-type single-phase optical voltage transformer comprising:
the optical voltage sensor head and the electrical unit of claim 2; and
an insulator, a high-voltage electrode, a tank, a probe, a probe support, an optical fiber and a gas-tight optical fiber extractor, wherein:
one end of the high-voltage electrode is placed outside the tank, the other end of the high-voltage electrode is placed in the tank through the insulator;
on the bottom of the tank there is a mounting hole for setting the optical voltage sensor head, the probe and the probe support, the optical voltage sensor head, the probe and the probe support can be installed in the tank through the mounting hole, the gas-tight optical fiber extractor outside the tank is sealed-connected with the bottom of the tank at the place of the mounting hole so as to seal the mounting hole;

there is a distance between the high-voltage electrode and the optical voltage sensor head;

the bottom of the probe support is fixed-connected with the top of the gas-tight optical fiber extractor, the probe is set on the probe support, the optical voltage sensor head is placed at the location on the top surface of the probe corresponding to the other end of the high-voltage electrode; and the optical fiber connected with the optical fiber sensor head is extracted by the gas-tight optical fiber extractor to the electrical unit.

6. The optical voltage transformer according to claim 5, wherein:

the optical fiber extracting method of the gas-tight optical fiber extractor uses optical fiber metallized packaging technology;

the gas-tight optical fiber extractor includes a metallized fiber, a metal tube, a sealing ring, a fiber extracting flange and a fiber through hole;

the fiber through hole is on the fiber extracting flange, the metal tube goes through the fiber through hole and it is sealed between the metal tube and the fiber through hole;

the metallized fiber goes through the metal tube and it is sealed between the metallized fiber and the metal tube; and the sealing ring is embedded on the sealing surface of the fiber extracting flange and circles the fiber through hole.

7. A tank-type three-phase optical voltage transformer, comprising:

the optical voltage sensor head and the electrical unit of claim 2; and an insulator, a tank and an optical voltage transformer unit, wherein:

the insulator is set on one end of the tank;

the optical voltage sensor head is included in the optical voltage transformer unit, the optical voltage transformer unit has three sets, i.e. A, B, C phase, respectively, is set in the tank, each set of the optical voltage transformer unit includes a distance-expanded conductor, a high-voltage electrode, a shielding cylinder, an optical voltage sensor head, a probe, an optical fiber, a gas-tight optical fiber extractor and a probe support;

one end of the distance-expanded conductor is fixed-connected with the insulator, the other end is fixed-connected with the high-voltage electrode;

the shielding cylinder is set opposite to the insulator in the bottom of the tank;

the free end of the high-voltage electrode extends into the shielding cylinder;

on the bottom of the tank there is a mounting hole for setting the optical voltage sensor head, the probe and the probe support, the optical voltage sensor head, the probe and the probe support can be installed in the tank through the mounting hole, the gas-tight optical fiber extractor outside the bottom of the tank is sealed-connected with the bottom of the tank at the place of the mounting hole so as to seal the mounting hole;

the probe and the optical voltage sensor head are set in the shielding cylinder;

the bottom of the probe support is fixed-connected with the top of the gas-tight optical fiber extractor, the probe is set on the probe support, the optical voltage sensor head is placed at the location on the top surface of the probe corresponding to the other end of the high-voltage electrode, there is a distance between the high-voltage electrode and the optical voltage sensor head; the optical fiber connected with the optical fiber sensor head is extracted by the gas-tight optical fiber extractor to the electrical unit.

8. The optical voltage transformer according to claim 7, wherein:

the optical fiber extracting method of the gas-tight optical fiber extractor uses optical fiber metallized packaging technology;

the gas-tight optical fiber extractor includes a metallized fiber, a metal tube, a sealing ring, a fiber extracting flange and a fiber through hole;

the fiber through hole is on the fiber extracting flange, the metal tube goes through the fiber through hole and it is sealed between the metal tube and the fiber through hole;

the metallized fiber goes through the metal tube and it is sealed between the metallized fiber and the metal tube; and the sealing ring is embedded on the sealing surface of the fiber extracting flange and circles the fiber through hole.

9. A suspension electrode type optical voltage transformer, comprising:

the optical voltage transformer and the electrical unit of claim 2; and an insulator, a high-voltage electrode, a transformer casing, a suspension electrode, a sealing ring, a ground pole, an insulating support, a transformer external housing and an optical fiber, wherein:

the insulator is fixed-connected to one end of the transformer casing, the outward face of the other end of the transformer casing is fixed-connected to the transformer external housing;

the ground pole is set on the transformer external housing;

the sealing ring is set on the connection place of the transformer casing and the transformer external housing;

one end of the high-voltage electrode extends into the transformer casing by the insulator and is fixed-connected with the insulator;

the suspension electrode sealed-fixed on the joint of the transformer casing and the transformer external housing by the insulating support, and its both ends extend into the transformer casing and the transformer external housing, respectively;

the optical voltage sensor head is set on the inner bottom of the transformer external housing, the optical fiber connected with the optical voltage sensor head is extracted to the transformer external housing, and then to the electrical unit by the transformer external housing.

10. The optical voltage transformer according to claim 1, wherein:

the signal processing unit includes a second detector, a third detector and a signal demodulation circuit;

the second detector and the third detector transform respectively the two paths of optical signal emitted by the optical voltage sensor head into electrical signal and then transmit them to the signal demodulation circuit; and the signal demodulation circuit calculates the sliding averages of the two detecting channels, i.e., the second detector and the third detector, respectively, and then calculates the ratio of AC to DC, weighted averages the two paths of detecting signal, so that the two voltage amplitudes go to balance, and finally generates frame with the resulting voltage values according to communication protocol and transmits them through the serial port.

11. An optical voltage transformer integrated in a GIS cavity, comprising:
  the optical voltage sensor head and the electrical unit of claim 1;
  a GIS cavity, a high-voltage bus, a probe, a probe support, a gas-tight optical fiber extractor and an optical fiber, wherein:
    the high-voltage bus is placed in the GIS cavity;
    on the bottom of the GIS cavity there is a mounting hole for setting the optical voltage sensor head, the probe and the probe support, the optical voltage sensor head, the probe and the probe support can be installed in the GIS cavity through the mounting hole, the gas-tight optical fiber extractor outside the bottom of the GIS cavity is sealed-connected with the bottom of the GIS cavity at the place of the mounting hole so as to seal the mounting hole;
    the bottom of the probe support is fixed-connected with the top of the gas-tight optical fiber extractor, the probe is set on the probe support, the optical voltage sensor head is placed on the top surface of the probe, there is a distance between the optical voltage sensor head and the high-voltage bus; and
    the optical fiber connected with the optical fiber sensor head is extracted by the gas-tight optical fiber extractor to the electrical unit.

12. The optical voltage transformer according to claim 11, wherein:
  the optical fiber extracting method of the gas-tight optical fiber extractor uses optical fiber metallized packaging technology;
  the gas-tight optical fiber extractor includes a metallized fiber, a metal tube, a sealing ring, a fiber extracting flange and a fiber through hole;
  the fiber through hole is on the fiber extracting flange, the metal tube goes through the fiber through hole and it is sealed between the metal tube and the fiber through hole;
  the metallized fiber goes through the metal tube and it is sealed between the metallized fiber and the metal tube; and
  the sealing ring is embedded on the sealing surface of the fiber extracting flange and circles the fiber through hole.

13. The optical voltage transformer according to claim 11, wherein:
  the distance between the high-voltage bus and the optical voltage sensor head can be adjusted by adjusting the height of the probe support so as to improve the testing accuracy; and/or
  the optical voltage sensor head is set in the center of the top surface of the probe; and/or the GIS cavity is filled with $SF_6$ insulating gas.

14. The optical voltage transformer according to claim 11, wherein the connection between the optical voltage sensor head and the probe surface is bonding.

15. A tank-type single-phase optical voltage transformer, comprising:
  the optical voltage sensor head and the electrical unit of claim 1; and
  an insulator, a high voltage electrode, a tank, a probe, a probe support, an optical fiber and a gas-tight optical fiber extractor, wherein:
    one end of the high-voltage electrode is placed outside the tank, the other end of the high-voltage electrode is placed in the tank through the insulator;
    on the bottom of the tank there is a mounting hole for setting the optical voltage sensor head, the probe and the probe support, the optical voltage sensor head the probe and the probe support can be installed in the tank through the mounting hole, the gas-tight optical fiber extractor outside the tank is sealed-connected with the bottom of the tank at the place of the mounting hole so as to seal the mounting hole; there is a distance between the high-voltage electrode and the optical voltage sensor head; and
    the bottom of the probe support is fixed-connected with the top of the gas-tight optical fiber extractor, the probe is set on the probe support, the optical voltage sensor head is placed at the location on the top surface of the probe corresponding to the other end of the high-voltage electrode; the optical fiber connected with the optical fiber sensor head is extracted by the gas-tight optical fiber extractor to the electrical unit.

16. The optical voltage transformer according to claim 15, further comprising:
  an inflation-and-outlet valve connected to the tank, and/or
  an explosion-proof membrane connected to the tank.

17. The optical voltage transformer according to claim 15, wherein:
  the insulator is fixed on top of the tank, the probe is installed on top of the probe support, the optical voltage sensor head is set in the center of the top surface of the probe; and/or
  the tank is filled with $SF_6$ insulating gas; and/or
  the distance between the high-voltage electrode and the optical voltage sensor head can be adjusted according to the different voltage levels so as to improve the testing accuracy.

18. The optical voltage transformer according to claim 15, wherein:
  the insulator is a basin insulator; and
  the optical fiber is single-mode fiber.

19. The optical voltage transformer according to claim 15, wherein:
  the optical fiber extracting method of the gas-tight optical fiber extractor uses optical fiber metallized packaging technology;
  the gas-tight optical fiber extractor includes a metallized fiber, a metal tube, a sealing ring, a fiber extracting flange and a fiber through hole;
  the fiber through hole is on the fiber extracting flange, the metal tube goes through the fiber through hole and it is sealed between the metal tube and the fiber through hole;
  the metallized fiber goes through the metal tube and it is sealed between the metallized fiber and the metal tube; and
  the sealing ring is embedded on the sealing surface of the fiber extracting flange and circles the fiber through hole.

20. A tank-type three-phase optical voltage transformer, comprising:
  the optical voltage sensor head and the electrical unit of claim 1; and an insulator, a tank and an optical voltage transformer unit, wherein:

the insulator is set on one end of the tank;

the optical voltage sensor head is included in the optical voltage transformer unit, the optical voltage transformer unit has three sets, i.e. A, B, C phase, respectively, is set in the tank, each set of the optical voltage transformer unit includes a distance-expanded conductor, a high-voltage electrode, a shielding cylinder, an optical voltage sensor head, a probe, an optical fiber, a gas-tight optical fiber extractor and a probe support;

one end of the distance-expanded conductor is fixed-connected with the insulator, the other end is fixed-connected with the high-voltage electrode; the shielding cylinder is set opposite to the insulator in the bottom of the tank; the free end of the high-voltage electrode extends into the shielding cylinder;

on the bottom of the tank there is a mounting hole for setting the optical voltage sensor head, the probe and the probe support, the optical voltage sensor head, the probe and the probe support can be installed in the tank through the mounting hole, the gas-tight optical fiber extractor outside the bottom of the tank is sealed-connected with the bottom of the tank at the place of the mounting hole so as to seal the mounting hole;

the probe and the optical voltage sensor head are set in the shielding cylinder;

the bottom of the probe support is fixed-connected with the top of the gas-tight optical fiber extractor, the probe is set on the probe support, the optical voltage sensor head is placed at the location on the top surface of the probe corresponding to the other end of the high-voltage electrode, there is a distance between the high-voltage electrode and the optical voltage sensor head; and the optical fiber connected with the optical fiber sensor head is extracted by the gas-tight optical fiber extractor to the electrical unit.

21. The optical voltage transformer according to claim 20, wherein:

the insulator, the distance-expanded conductor and the high-voltage electrode are equipotential, the shielding cylinder and the tank have equipotential connection to the ground electrode; and/or the distance-expanded conductor can be adjusted, the high-voltage electrode is fixed on the distance-expanded conductor, through adjusting the distance-expanded conductor, the high-voltage electrode can be adjusted to go to or away the center of the cylindrical surface of the shielding cylinder; and/or the shielding cylinder uses the material with the resistivity of less than 90 and the linear expansion coefficient of less than $24.0 \times 10^{-6}$/K.

22. The optical voltage transformer according to claim 20, wherein:

the optical fiber extracting method of the gas-tight optical fiber extractor uses optical fiber metallized packaging technology;

the gas-tight optical fiber extractor includes a metallized fiber, a metal tube, a sealing ring, a fiber extracting flange and a fiber through hole;

the fiber through hole is on the fiber extracting flange, the metal tube goes through the fiber through hole and it is sealed between the metal tube and the fiber through hole;

the metallized fiber goes through the metal tube and it is sealed between the metallized fiber and the metal tube; and the sealing ring is embedded on the sealing surface of the fiber extracting flange and circles the fiber through hole.

23. A suspension electrode type optical voltage transformer, comprising:

the optical voltage transformer and the electrical unit of claim 1; and an insulator, a high-voltage electrode, a transformer casing, a suspension electrode, a sealing ring, a ground pole, an insulating support, a transformer external housing and an optical fiber, wherein:

the insulator is fixed-connected to one end of the transformer casing, the outward face of the other end of the transformer casing is fixed-connected to the transformer external housing;

the ground pole is set on the transformer external housing; the sealing ring is set on the connection place of the transformer casing and the transformer external housing;

one end of the high-voltage electrode extends into the transformer casing by the insulator and is fixed-connected with the insulator;

the suspension electrode is sealed-fixed on the joint of the transformer casing and the transformer external housing by the insulating support, and its both ends extend into the transformer casing and the transformer external housing, respectively; and the optical voltage sensor head is set on the inner bottom of the transformer external housing, the optical fiber connected with the optical voltage sensor head is extracted to the transformer external housing, and then to the electrical unit by the transformer external housing.

24. The optical voltage transformer according to claim 23, further comprising:

an optical fiber protection box, the optical fiber connected with the optical voltage sensor head is extracted from the transformer external housing and then is led to the electrical unit through the optical fiber extracting hole in the optical fiber protection box; and/or a GIS cavity of the transformer station, the GIS cavity of the transformer station is grounded, the transformer casing is connected to the GIS cavity of the transformer station, and the GIS cavity of the transformer station is filled with $SF_6$ insulating gas; and/or the ground pole is grounded in maintenance.

25. The optical voltage transformer according to claim 1, wherein the optical voltage sensor head is in the primary system of electric power system, and the electrical unit is in the secondary system of electric power system.

26. The optical voltage transformer according to claim 1, wherein:

the BGO crystal is on the ground electrode of electric field in the primary system of electric power system, and the contact surface of the BGO crystal with the ground electrode is plated a chromium-gold film; and/or the polarizer and the ¼ wave plate are realized by integral machining technology.

* * * * *